United States Patent
Owa

(10) Patent No.: US 8,792,081 B2
(45) Date of Patent: Jul. 29, 2014

(54) CONTROLLER FOR OPTICAL DEVICE, EXPOSURE METHOD AND APPARATUS, AND METHOD FOR MANUFACTURING DEVICE

(75) Inventor: Soichi Owa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 877 days.

(21) Appl. No.: 12/266,367

(22) Filed: Nov. 6, 2008

(65) Prior Publication Data

US 2009/0117494 A1    May 7, 2009

Related U.S. Application Data

(60) Provisional application No. 60/996,405, filed on Nov. 15, 2007.

(30) Foreign Application Priority Data

Nov. 6, 2007   (JP) ................................. 2007-289090

(51) Int. Cl.
    *G03B 27/32*    (2006.01)

(52) U.S. Cl.
    USPC .............................. 355/67; 355/71; 250/205

(58) Field of Classification Search
    CPC ....... G03B 27/522; G03B 27/54; G03B 27/72
    USPC ...................................... 355/67, 71; 250/205
    See application file for complete search history.

(56) References Cited

U.S. PATENT DOCUMENTS

| | | |
|---|---|---|
| 5,312,513 A | 5/1994 | Florence et al. |
| 5,754,305 A | 5/1998 | DeClerck et al. |
| 5,870,205 A | 2/1999 | DeClerck et al. |
| 6,737,662 B2 | 5/2004 | Mulder et al. |
| 6,885,493 B2 | 4/2005 | Ljungblad et al. |
| 6,891,655 B2 | 5/2005 | Grebinski et al. |
| 6,900,915 B2 | 5/2005 | Nanjyo et al. |
| 6,958,806 B2 | 10/2005 | Mulder et al. |
| 7,015,491 B2 | 3/2006 | Eurlings et al. |
| 7,095,546 B2 | 8/2006 | Mala et al. |
| 7,116,403 B2 | 10/2006 | Troost et al. |

(Continued)

FOREIGN PATENT DOCUMENTS

| | | |
|---|---|---|
| EP | 0 779 530 A1 | 6/1997 |
| EP | 1 865 359 A1 | 12/2007 |

(Continued)

OTHER PUBLICATIONS

Extended European Search Report from European Patent Application No. 08846902.8, Mar. 30, 2011.

*Primary Examiner* — Daborah Chacko Davis
(74) *Attorney, Agent, or Firm* — Miles & Stockbridge P.C.

(57) ABSTRACT

An exposure method for exposing a mask pattern, which includes plural types of patterns, with a high throughput and optimal illumination conditions for each type of pattern. The method includes guiding light from a first spatial light modulator illuminated with pulse lights of illumination light to a second spatial light modulator and exposing a wafer with light from the second spatial light modulator, accompanied by: controlling a conversion state of the second spatial light modulator including a plurality of second mirror elements; and controlling a conversion state of the first spatial light modulator including a plurality of first mirror elements to control intensity distribution of the illumination light on a predetermined plane between the first spatial light modulator and the second spatial light modulator.

34 Claims, 9 Drawing Sheets

(56) References Cited

U.S. PATENT DOCUMENTS

| | | |
|---|---|---|
| 2005/0095749 A1 | 5/2005 | Krellmann et al. |
| 2006/0017902 A1 | 1/2006 | Rhyzhikov et al. |
| 2006/0138349 A1 | 6/2006 | Bleeker et al. |
| 2007/0013888 A1 | 1/2007 | Flagello et al. |
| 2007/0165202 A1 | 7/2007 | Koehler et al. |
| 2007/0273853 A1 | 11/2007 | Bleeker et al. |
| 2007/0285638 A1* | 12/2007 | Ravensbergen et al. ........ 355/53 |
| 2008/0079930 A1 | 4/2008 | Klarenbeek |
| 2008/0239268 A1 | 10/2008 | Mulder et al. |
| 2008/0259304 A1 | 10/2008 | Dierichs |

FOREIGN PATENT DOCUMENTS

| | | |
|---|---|---|
| JP | 06-281869 A | 10/1994 |
| JP | 6-291023 A | 10/1994 |
| JP | 8-313842 A | 11/1996 |
| JP | 10-503300 A | 3/1998 |
| JP | 11-3849 A | 1/1999 |
| JP | 2002-353105 A | 12/2002 |
| JP | 2004-78136 A | 3/2004 |
| JP | 2004-520618 T | 7/2004 |
| JP | 2005-524112 A | 8/2005 |
| JP | 2006-013518 A | 1/2006 |
| JP | 2006-113437 A | 4/2006 |
| JP | 2006-513442 A | 4/2006 |
| JP | 2006-524349 A | 10/2006 |
| WO | WO 96/35973 A1 | 11/1996 |
| WO | WO 99/49504 A1 | 9/1999 |
| WO | WO 02/063371 A1 | 8/2002 |
| WO | WO 03/093167 A1 | 11/2003 |
| WO | WO 2004/061488 A1 | 7/2004 |
| WO | WO 2004/094301 A1 | 11/2004 |
| WO | WO 2006/097135 A1 | 9/2006 |
| WO | WO 2008/061681 A2 | 5/2008 |
| WO | WO 2008/131928 A1 | 11/2008 |

* cited by examiner

US 8,792,081 B2

CONTROLLER FOR OPTICAL DEVICE, EXPOSURE METHOD AND APPARATUS, AND METHOD FOR MANUFACTURING DEVICE

CROSS-REFERENCE TO RELATED APPLICATIONS

This application claims the benefit of Japanese Patent Application No. 2007-289090, filed on Nov. 6, 2007 and U.S. Provisional Application No. 60/996,405, filed on Nov. 15, 2007.

BACKGROUND

The present invention relates to an exposure technique for exposing an object with a plurality of optical elements capable of spatially transforming light (spatially modulating light) and to a device manufacturing technique using such exposure technique.

In a lithography process for manufacturing devices (electronic devices and micro-devices), such as semiconductor devices and liquid crystal display devices, an exposure apparatus such as a batch exposure type projection exposure apparatus, like a stepper, or a scanning exposure type projection exposure apparatus, like a scanning stepper, is used to transfer a predetermined pattern onto a wafer (or glass plate etc.).

In an exposure apparatus of the prior art, to form different circuit patterns in a plurality of layers on a device that is subject to processing, masks are exchanged for each layer to perform exposure. Further, when a circuit pattern for a single layer includes, for example, two types of circuits patterns having different microscopic levels, mask patterns for the two types of circuit patterns are formed on two different masks. The patterns of the two masks are sequentially exposed in a superimposed manner onto a wafer while optimizing illumination conditions to perform double exposure. In this manner, when exchanging masks for each device, each layer, or each pattern type, throughput is decreased in the exposure process.

Therefore, an exposure apparatus has been proposed to use, in lieu of masks, two mirror devices including an array of a plurality of movable micro-mirrors and control the direction of reflection light for each micro-mirror of the two mirror devices in order to produce light intensity distribution in correspondence with a transfer pattern (for example, refer to Japanese Laid-Open Patent Publication No. 2006-13518). In this exposure apparatus, the two mirror devices are illuminated with linear polarized lights of which polarization directions are orthogonal to each other. Two types of patterns are simultaneously exposed by synthesizing light beams from the two mirror devices and generating illumination light that exposes a wafer.

SUMMARY

In the exposure apparatus of the prior art that uses mirror devices, to substantially expose two types of patterns during a single exposure, the two mirror devices must be simultaneously illuminated with illumination lights of different polarization states. As a result, the mechanism for producing light intensity distribution in correspondence with a mask pattern is complicated, and the structure of an illumination optical system is complicated.

Further, the polarization direction of the lights from the two mirror devices must always be orthogonal to each other. Thus, the two types of patterns that can be simultaneously exposed are limited to patterns that are illuminated with illumination light of different polarization states.

Accordingly, it is an object of the present invention to provide an exposure technique, which increases throughput and easily optimizes the illumination conditions for each of plural types of patterns when exposing a pattern including the plural types of patterns, and a device manufacturing technique using such an exposure technique.

In the present invention, an exposure method for exposing an object with a plurality of pulse lights includes guiding light from a first optical device (13) illuminated by the pulse lights to a second optical device (25) and exposing (step 107) the object with light from the second optical device (25); accompanied by: a first step (step 104) of controlling a conversion state of the second optical device (25) that includes a plurality of second optical elements (5); and a second step (step 106) of controlling a conversion state of the first optical device (13) that includes a plurality of first optical elements (3) to control intensity distribution of the pulse lights on a predetermined plane between the first optical device (13) and the second optical device (25).

In the present invention, an exposure apparatus for illuminating an irradiated plane with a plurality of pulse lights and exposing an object with the plurality of pulse lights from the irradiated plane includes an illumination optical system (ILS) arranged upstream of the irradiated plane and including a first optical device (13) which includes a plurality of first optical elements (3); a second optical device (25) arranged on or near the irradiated plane and including a plurality of second optical elements (5); and an illumination controller (30, 45, 31) which controls a conversion state of the first optical device (13) or a conversion state of the second optical device (25).

In the present invention, a controller for controlling a conversion state of a first optical device (13) and a conversion state of a second optical device (25) includes a main control unit (30) which controls the conversion state of the first optical device (13) or the conversion state of the second optical device (25) whenever a plurality of pulse lights are emitted from a light source.

In the present invention, when exposing a mask pattern including plural types of patterns, for example, the conversion state of a second optical device is controlled for each of a predetermined number of pulse lights to sequentially produce variable light intensity distribution substantially corresponding to the plural types of patterns, and an object is exposed with light having such light intensity distribution. This exposes the mask pattern in a manner enabling high throughput to be obtained.

During exposure, the conversion state of the first optical device is controlled in accordance with the conversion state of the second optical device or the pattern that is to be formed on the object (e.g., pattern data of mask pattern, mask, or exposure subject, pattern that is to be formed on then object, and pattern data) to control the distribution of the inclination angle of light entering the second optical device. This easily optimizes the illumination conditions for each of the plural types of patterns.

DETAILED DESCRIPTION OF THE DRAWINGS

DETAILED DESCRIPTION OF THE PREFERRED EMBODIMENTS

A first embodiment of the present invention will now be discussed with reference to FIGS. 1 to 7.

Figure 1:
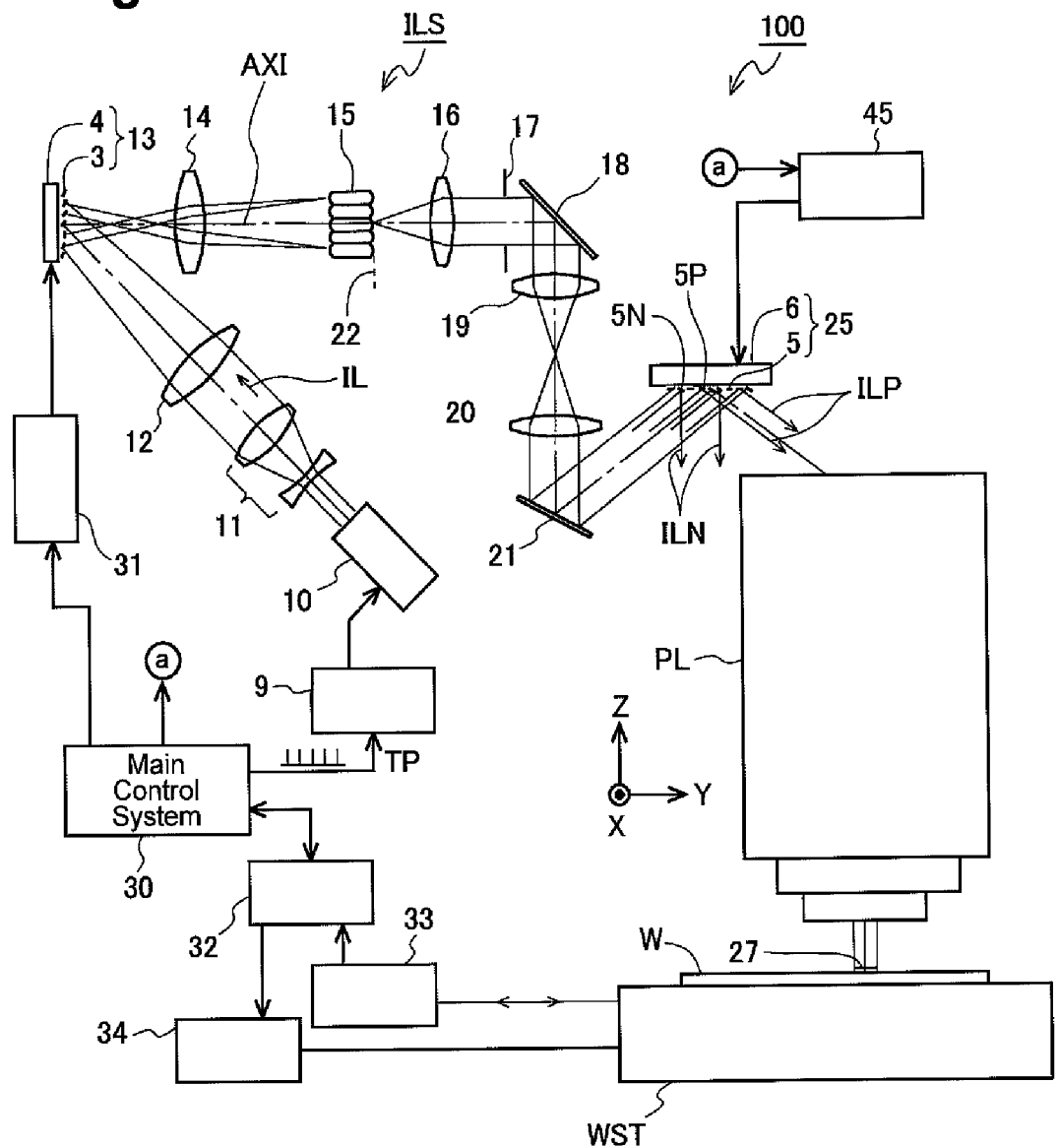
FIG. 1 is a schematic diagram showing an exposure apparatus according to a first embodiment of the present invention.

FIG. 1 is a schematic diagram showing an exposure apparatus 100 of this embodiment. The exposure apparatus 100 includes an exposure light source 10, an illumination optical system ILS, and a second spatial light modulator 25. The light source 10 emits pulse lights. The illumination optical system ILS illuminates an irradiated plane with exposure illumination light (exposure light) IL from the light source 10. The second spatial light modulator 25 includes a two-dimensional array of a plurality of mirror elements 5, which are micromirrors having variable inclination angles and are arranged on or near the irradiated plane. Further, the exposure apparatus 100 includes a projection optical system PL, a wafer stage WST, a main control system 30, and various control systems. The projection optical system PL receives illumination light IL, which substantially corresponds to light from a variable pattern that is to be formed by the mirror elements 5, and projects an image of the pattern onto a wafer W (photosensitive substrate). The wafer state WST positions and moves the wafer W. The main control system 30 is formed by a computer that controls the operation of the entire apparatus. In FIG. 1, the Z axis is set to be orthogonal to a guide surface (not shown) of the wafer stage WST. In a plane orthogonal to the Z axis, the Y axis is set to be parallel to the plane of FIG. 1, and the X axis is set to be orthogonal to the plane of FIG. 1. In this embodiment, the wafer W is scanned in the Y direction (scanning direction) during exposure.

As the light source 10 of FIG. 1, an ArF excimer laser light source is used which emits substantially linear polarization light having a wavelength of 193 nm and a pulse width of about 50 ns in pulse lights at a frequency of 4 to 6 kHz. As the light source 10, a KrF excimer laser light source generating pulse lights having a wavelength of 248 nm, an $F_2$ laser light source generating pulse lights having a wavelength of 157 nm, and a light-emitting diode generating pulse lights may also be used. Further, as the light source 10, a solid pulse laser light source that generates high harmonic wave laser light output from a YAG laser, semiconductor laser, or the like may be used. Alternatively, a solid pulse laser light source that generates high harmonic wave laser light by amplifying semiconductor laser light with a fiber amplifier can be used. A solid pulse laser light source, for example, emits laser light having a wavelength of 193 nm (other wavelengths are also possible) and a pulse width of about 1 ns in pulse lights at a frequency of 1 to 2 MHz.

In this embodiment, a power supply control unit 9 is connected to the light source 10. The main control system 30 of the exposure apparatus 100 provides the power supply control unit 9 with light emission trigger pulses TP, which is for instructing the timing and light intensity (pulse energy) of the pulse light emissions. In synchronism with the light emission trigger pulses, the power supply control unit 9 emits pulse lights in accordance with the instructed timing and light intensity.

The illumination light IL emitted from the light source 10 and formed by laser pulse lights, which are substantially parallel light beams each having a rectangular cross-section, enters a beam expander 11. The beam expander 11, which includes a concave lens and a convex lens, enlarges the cross-sectional shape of the illumination light IL to a predetermined shape. A converging lens 12 illuminates the reflection surfaces of a plurality of mirror elements 3, which are micromirrors having variable inclination angles and arranged in a two-dimensional array on an upper surface of a first spatial light modulator 13, with the illumination light IL emitted from the beam expander 11. The spatial light modulator 13 includes a drive unit 4, which independently controls the inclinations angle of the reflection surface of each mirror element 3 about two perpendicular axes. The spatial light modulator 13 independently controls the inclination direction and inclination angle of the reflection surface of each mirror element 3 (controls the conversion state of the spatial light modulator 13) so that the illumination light IL is reflected in any number of directions (described later in detail). Further, the spatial light modulator 13 forms a desired pupil brightness distribution in a far field. Whenever a predetermined number of pulse lights (one pulse light or a plurality of pulse lights) of the illumination light IL is emitted, the spatial light modulator 13 provides a modulation control unit 31 with information on illumination conditions based on information of a transfer pattern. Accordingly, the modulation control unit 31 provides the drive unit 4 with setting information on the inclination direction and inclination angle of each mirror element 3. Further, the main control system 30 may provide, in advance, the modulation control unit 31 with the information on illumination conditions based on the information on the transfer pattern, and the modulation control unit 31 may provide the drive unit 4 with the setting information on the inclination direction and inclination angle of each mirror element 3 in accordance with the pulse light emissions of the illumination light IL. In such a case, the main control system 30 may provide the modulation control unit 31 with the light emission trigger pulses TP.

A polarization optical system (not shown), which combines, for example, a half wavelength plate for changing the polarization direction of the illumination light IL, a quarter wavelength plate for converting the illumination light into circular polarized light, and a wedge-type double refraction prism (a wedge-type birefringent prism) for converting predetermined linear light into random polarized light (unpolarized light) may be arranged between the beam expander 11 and the converging lens 12. By using such a polarization optical system, the polarization state of the illumination light IL irradiating the wafer W may be controlled to obtain linear polarization, in which the polarization direction is the X direction or the Y direction, circular polarization, or unpolarization so as to perform the so-called polarization illumination.

The reflection surfaces of the spatial light modulator 13 (reflection surfaces of the plurality of mirror elements 3), and a first optical system including a relay optical system 14, and a fly's eye lens 15 (optical integrator) are arranged along the optical axis AXI of the illumination optical system ILS. The illumination light IL reflected by each mirror element 3 of the spatial light modulator 13 enters the fly's eye lens 15 via the relay optical system 14. The reflection surface of each mirror element 3 is substantially arranged on a front focal plane of the relay optical system 14, and the incident surface of the fly's eye lens 15 is substantially arranged on the rear focal plane of the relay optical system 14. However, this layout is not limited in any manner. The relay optical system 14 functions to converge the illumination light IL reflected by each mirror element 3 onto a predetermined range about a position on the fly's eye lens 15 in the X direction and the Z direction determined in accordance with the angle of the illumination light IL relative to the optical axis AXI.

In other words, the illumination light IL entering the spatial light modulator 13 is divided and provided for each mirror element 3 and then selectively deflected (reflected) in a predetermined direction and predetermined angle in accordance with the inclination direction and inclination angle of each mirror element 3. Then, the reflection light from each mirror element 3 enters the incidence surface of the fly's eye lens 15 from a position that is in accordance with the direction and angle.

The illumination light IL entering the fly's eye lens 15 is two-dimensionally divided by a plurality of lens elements to form a light source on the rear focal plane of each lens element. This forms on a pupil plane (illumination pupil plane 22) of the illumination optical system IL, or the rear focal plane of the fly's eye lens 15, a secondary light source having substantially the same light intensity distribution as the illumination region formed by the light beams entering the fly's eye lens 13. That is, a secondary light source is formed by substantially planar light sources. In this embodiment, the inclination direction and inclination angle of the reflection surface of each mirror element 3 in the spatial light modulator 13 is independently controlled to control the light intensity distribution on the incident surface of the fly's eye lens 15 and ultimately, the light intensity distribution of the secondary light source on the illumination pupil plane 22 at any distribution. A micro-lens array or the like may be used in lieu of the fly's eye lens 15.

In this embodiment, the second spatial light modulator 25, which is arranged on the irradiated plane or a plane near the irradiated plane, undergoes Köhler illumination. Thus, the plane on which the above-described secondary light source is formed is conjugated with an aperture stop (not shown) of the projection optical system PL and may be considered as the illumination pupil plane 22 of the illumination optical system ILS. Typically, the irradiated plane (the plane on which the second spatial light modulator 25 is arranged or the plane of which the wafer W is arranged) for the illumination pupil plane 22 serves as an optical Fourier transform plane. The brightness distribution refers to brightness distribution (pupil brightness distribution) on the illumination pupil plane 22 of the illumination optical system ILS or a plane conjugated with the illumination pupil plane 22. However, when the fly's eye lens 15 has a large number of divided wavefronts, the main brightness distribution on the incident surface of the fly's eye lens 15 is highly interrelated with the main brightness distribution on the entire secondary light source (pupil brightness distribution). Thus, the brightness distribution on the incident surface of the fly's eye lens 15 and on a plane conjugated with the incident surface may be considered as the pupil brightness distribution.

One example of a spatial light modulator carries out spatial modulation on predetermined light. In this embodiment, the conversion state of the spatial light modulator is a state in which the entrance or exit of light into or out of the spatial light modulator changes the amplitude, transmittance, phase, and in-plane distribution of the light. For example, in a reflective type spatial light modulator, a conversion state of the spatial light modulator refers to a change in the inclination direction and inclination angle of each mirror element or a change in the distribution of the inclination direction and inclination angle of each mirror element. The conversion state may also refer to, for example, the supplying and cutting of drive power to each mirror element, as will be described later or the distribution of the supplying and cutting. Further, as will be described later, the spatial light modulator includes a phase type spatial light modulator and a transmissive type spatial light modulator.

In FIG. 1, the illumination light IL, which is from the secondary light source and formed on the illumination pupil plane 22, travels through a second optical system including a first relay lens 16, a field stop 17, an optical path deflection mirror 18, a second relay lens 19, a condenser optical system 20, and a mirror 21, which deflects the optical path toward the irradiated plane (designed plane on which a transfer pattern is arranged). The illumination light IL reflected diagonally upward by the mirror 21 illuminates an illumination region 26 (refer to FIG. 4(A)) on the reflection surfaces of the plurality of mirror elements 5 in the second spatial light modulator 25, which is arranged on the irradiated plane or a plane near the irradiated plane, with a uniform illumination distribution. The optical members included between the beam expander 11 and the condenser optical system 20 forms the illumination optical system ILS. The illumination optical system ILS, the mirror 21, and the spatial light modulator 25 are supported by a frame (not shown).

Figure 4A:
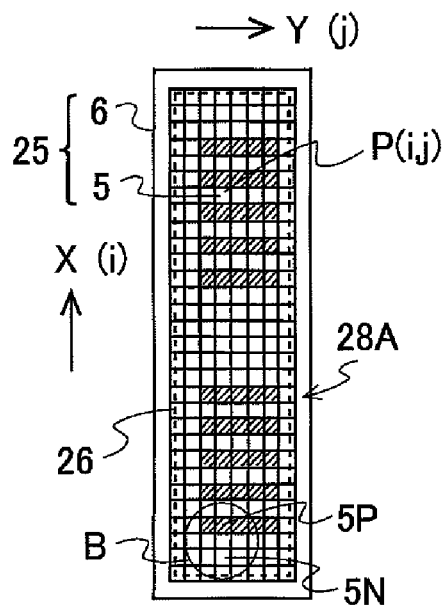
FIG. 4(A) is a diagram showing one example of a pattern on a reflection surface of a spatial light modulator 25 of FIG. 1.

FIG. 4(A) is a diagram showing the reflection surface of the spatial light modulator 25 in this embodiment. In FIG. 4(A), the plurality of substantially square mirror elements 5 are arranged so that the reflection surface of the spatial light modulator 25 is elongated in the X direction and arranged at a constant pitch in the X direction and Y direction to be substantially in close contact with one another. That is, the mirror elements 5 are each arranged at a position P (i, j), which is the ith (i=1, 2, . . . ) in the X direction and the jth (j=1, 2, . . . ) in the Y direction. As one example, the ratio between the length of the reflection surface of the spatial light modulator 25 and the width of the reflection surface (scanning direction of the wafer W) is 4:1, with 1000 mirror elements 5 being arranged in the X direction. The rectangular illumination region 26, which is elongated in the X direction, is set to be slightly inward from the profile of the reflection surface of the spatial light modulator 25. The reflection surface of the spatial light modulator 25 may be substantially square.

Figure 4B:
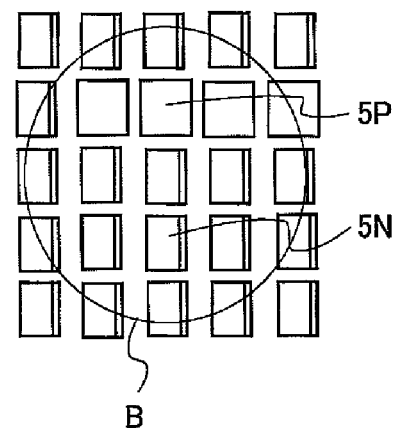
FIG. 4(B) is an enlarged view showing portion B of FIG. 4(A)

In this embodiment, the mirror elements 5 of the spatial light modulator 25 can each be switched between a first angle at which the reflection surface of the mirror element 5 is parallel to the XY plane (a state in which the drive power is cut in this embodiment) and a second angle rotated by a predetermined angle about the X axis (a sate in which the drive power is supplied in this embodiment). The spatial light modulator 25 includes a drive unit 6 for separately controlling the mirror elements 5 with respect to the angles of the reflection surfaces. As will be described later, whenever a predetermined number of pulse lights are emitted, the main control system 30 provides a modulation control unit 45, which is shown in FIG. 1, with information on patterns that should be exposed onto the wafer. In accordance with the information, the modulation control unit 45 provides the drive unit 6 with information on the setting of the reflection surface of each mirror element 5. Hereafter, as shown in FIG. 4(B), which is an enlarged view of portion B in FIG. 4(A), the mirror elements 5 set at the first angle is referred to as mirror elements 5P and the mirror elements 5 set at the second angle is referred to as mirror elements 5N. In this manner, the mirror elements 5 are only required to be switchable between two angles. Thus, the spatial light modulator 25 can be enlarged, and each mirror element 5 can be much smaller than the mirror elements 3 of the first spatial light modulator 13. Examples of the structure of the spatial light modulator 25 will be described in detail later.

Returning to FIG. 1, in one example, the projection optical system PL supported by a column (not shown) is a reduction projection optical system that is non-telecentric toward the spatial light modulator 25 (object plane) and telecentric toward the wafer W (image plane). That is, in the reflection light IL reflected by each mirror element 5 of the spatial light modulator 25, the projection optical system PL uses the illumination light entering diagonally relative to the Z axis to form a predetermine pattern image on the wafer W, to which resist (photosensitive material) is applied, in an exposure region 27 (region conjugated with the illumination region 26 of FIG. 4(A)).

In this case, in the spatial light modulator 25, the reflection light from each mirror element 5P, the reflection surface of which is set to the first angle (state in which the drive power is cut), diagonally enters the projection optical system PL and becomes an effective imaging light beam ILP. Reflection beam ILN from each mirror element 5N, the reflection surface of which is set at the second angle, is substantially reflected in the −Z direction and does not enter the projection optical system PL. Thus, the reflection beam ILN does not contribute to the formation of an image. The reflection surface angle (second angle) of the mirror elements 5N need only be an angle in which the reflection light from the mirror elements 5N does not enter the wafer W (an angle that does not contribute to image formation on the wafer W) and may be, for example, an angle at which the reflection light is shielded by an aperture stop (not shown) in the projection optical system PL. Hence, in the plurality of mirror elements 5 may be considered as a reflective mask pattern in which the mirror elements 5P correspond to reflection units and the mirror elements 5N correspond to non-reflection units. In this embodiment, the switching between the mirror elements 5P and the mirror elements 5N may be performed for each pulse light emission of the illumination light IL. Thus, the reflective mask pattern may be varied to any pattern for each pulse light emission using each mirror element 5 as a single unit.

By using the projection optical system PL, which is non-telecentric toward an object, the plane on which the plurality of mirror elements 5 of the spatial light modulator 25 are installed is arranged parallel to the plane on which the wafer W is arranged, that is, the exposure surface of the wafer W (upper surface of resist) so as to irradiate the wafer W with reflection light from the spatial light modulator 25 via the projection optical system PL. Further, the reflection light from the mirror elements 5P, which are in a state cut off from the drive power, serves as effective imaging light beams. This facilitates control of the spatial light modulator 25.

The projection optical system PL forms a reduced image of a variable pattern (or light intensity distribution substantially corresponding to the pattern) set by the spatial light modulator 25. For example, when the mirror elements 5 have a size of about 20×20 μm, the magnification of the projection optical system PL may be set to about 1/200 so that a variable pattern having a line width of 100 nm can be projected onto the wafer W. As described above, the mirror elements 5 are only required to be switched between two angles. This enables further miniaturization. For example, if the mirror elements 5 have a size of several micrometers and the magnification of the projection optical system PL is set to about 1/50, a variable pattern having a line width of 50 to 100 nm may be projected onto the wafer W.

In FIG. 1, a wafer holder (not shown) attracts and holds the wafer W on the wafer stage W. The wafer stage WST performs step movements in the X direction and the Y direction on a guide surface (not shown) and moves in the Y direction at a constant velocity. A laser interferometer 33, which measures the position of the wafer stage WST in the X direction and Y direction, the rotation angle of the wafer state WST about the Z axis, and the like, provides a stage control system 32 with information on the measurements. Based on control information from the main control system 30 and measurement information from the laser interferometer 33, the stage control system 32 controls the position and velocity of the wafer stage WST with a drive system 34, which includes a linear motor or the like. To align the wafer W, an alignment system (not shown) or the like is used to detect the position of an alignment mark on the wafer W.

Next, the structures of the spatial light modulators 13 and 25 shown in FIG. 1 will be discussed.

Figure 2A:
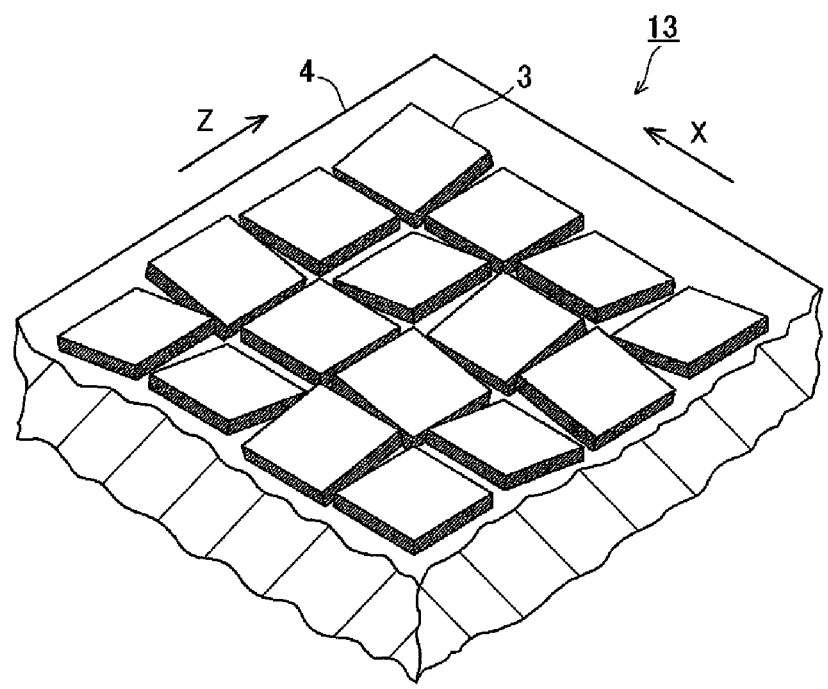
FIG. 2(A) is an enlarged perspective view showing part of a spatial light modulator 13 of FIG. 1.

FIG. 2(A) is an enlarged perspective view showing part of the spatial light modulator 13 in the illumination optical system ILS of FIG. 1. In FIG. 2(A), the spatial light modulator 13 includes the plurality of mirror elements 3, which are arranged at a constant pitch in the X direction and Z direction in close contact with one another, and the drive unit 4, which separately controls the plurality of mirror elements 3 with respect to the reflection surface angle. For example, several thousand mirror elements 3 are arranged in the X direction and the Z direction.

Figure 2B:
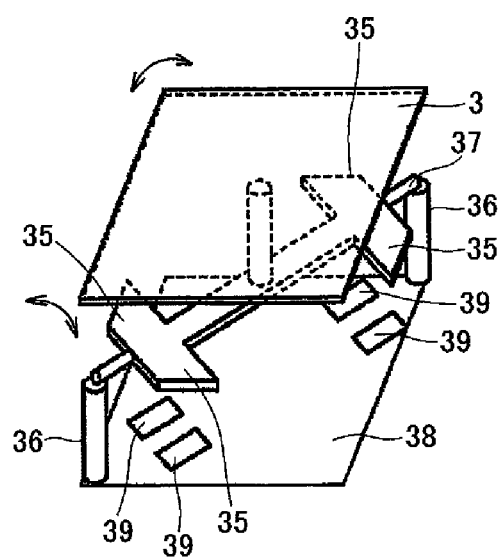
FIG. 2(B) is an enlarged perspective view showing a drive mechanism for a mirror element 3 of FIG. 1.

As shown in FIG. 2(B), in one example, the drive mechanism for a mirror element 3 includes a hinge member 37 for supporting the mirror element 3, four electrodes 35 extending from the hinge member 37, two rod members 36 supporting the hinge member 37 on a support substrate 38, and four electrodes 39 formed on the support substrate 38 facing toward the four electrodes 35. In this example, the potential difference between the corresponding electrodes 35 and 39 in each of the four sets is controlled so as to control the electrostatic force acting between the electrodes and tilt and incline the hinge member 37. This continuously controls the inclination angle of the reflection surface of the mirror element 3, which is supported by the hinge member 37, about two perpendicular axes within a predetermined variable range. The structure of the spatial light modulator 13 is described in detail in, for example, Japanese Laid-Open Patent Publication No. 2002-353105.

The mechanism for driving the mirror elements 3 is not limited to the structure of this embodiment and any other structure may be used. Further, the mirror elements 3 are substantially square planar mirrors but may have any shape such as a rectangle. However, from the viewpoint of efficient use of light, it is preferable that the mirror elements be shaped to allow for a layout that is free from gaps. Further, it is preferred that the interval between adjacent mirror elements 3 be minimized. In addition, the mirror elements 3 are shaped to be, for example, 20×20 µm. However, it is preferred that the mirror elements 3 be as small as possible to enable fine adjustments of the illumination conditions.

Figure 2C:
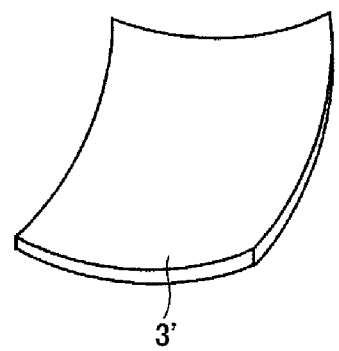
FIG. 2(C) is an enlarged perspective view showing a mirror element having a concave surface.

Furthermore, a mirror element 3' having a concave surface as shown in FIG. 2(C) or a mirror element having a convex surface (not shown) may be used as shown in FIG. 2(C).

Figure 3A:
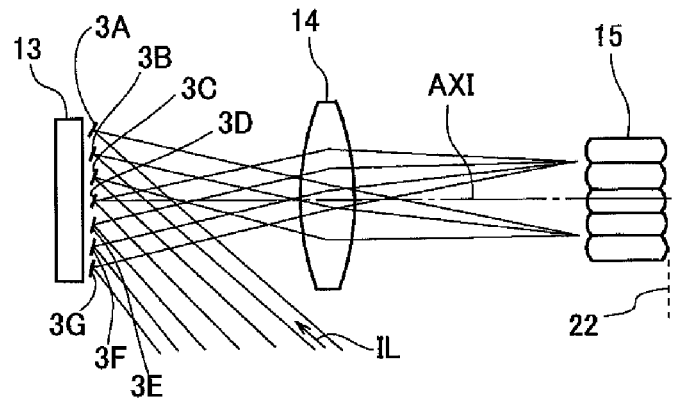
FIG. 3(A) is a diagram showing the inclination angle of the mirror element 3 in the spatial light modulator 13 of FIG. 1 during dipolar illumination.
Figure 3B:
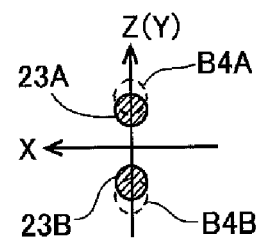
FIG. 3(B) is a diagram showing a secondary light source of FIG. 3(A)
Figure 3C:
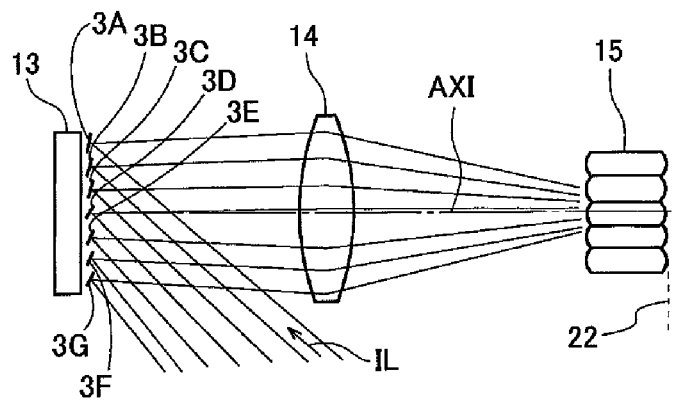
FIG. 3(C) is a diagram showing the inclination angle of the mirror element 3 in the spatial light modulator 13 during normal illumination.
Figure 3D:
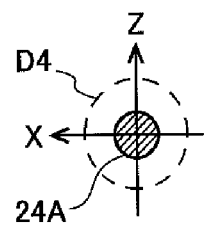
FIG. 3(D) is a diagram showing a secondary light source of FIG. 3(C)

FIGS. 3(A) and 3(C) each show the reflection light of a plurality of mirror elements 3A to 3G selected as representatives from a line of several thousand mirror elements 3 arranged in the Z direction of the spatial light modulator 13 of FIG. 1. FIGS. 3(B) and 3(D) show the shapes of secondary light sources (shown by hatching lines) on the illumination pupil plane 22 of FIGS. 3(A) and 3(C).

As shown in FIG. 3(A), the inclination angle about two axes (i.e., inclination direction and inclination angle) of each of the mirror elements 3A to 3G in the spatial light modulator 13 is set so that the corresponding reflection light is converged at two regions that are eccentric from the optical axis AXI on the incident surface of the fly's eye lens 15. As shown in FIG. 3(B), dipolar secondary light sources 23A and 23B are formed in the Z direction. In this case, the inclination direction and inclination angle of the mirror elements in the other lines of the spatial light modulator 13 are also set so that the reflection light is converged to the corresponding region of either one of the secondary light sources 23A and 23B and the intensity of the secondary light sources 23A and 23B are generally uniform (same hereafter). Further, by controlling only the inclination direction and inclination angle of each mirror element 3, the interval between the secondary light sources 23A and 23B can be controlled as shown by regions B4A and B4B. The Z direction in the illumination pupil plane 22 corresponds to the Y direction of the reflection surface of the spatial light modulator 25 (surface on which the light intensity distribution substantially corresponding to transfer pattern is formed).

By setting the inclination direction and inclination angle of each mirror element 3A to 3G in the spatial light modulator 13 so that the reflection light is converged in a region including the optical axis AXI on the incident surface of the fly's eye lens 15, a circular secondary light source 24A for normal illumination is formed as shown in FIG. 3(D). In this case, by setting only the inclination direction and inclination angle of each mirror element 3, the size (σ value) of the secondary light source 24A can be controlled as shown in region D4.

Figure 3E:
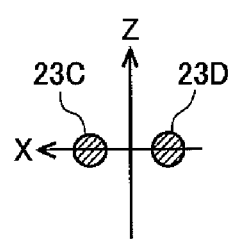
FIG. 3(E) is a diagram showing another dipolar secondary light source.
Figure 3F:
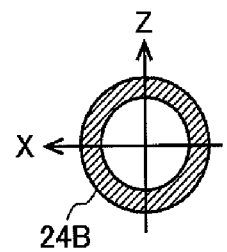
FIG. 3(F) is a diagram showing a secondary light source for annular illumination.

In the same manner, by separately controlling the mirror elements 3 with respect to the reflection surface inclination angle about two axes, dipolar secondary light sources 23C and 23D can be formed in the X direction as shown in FIG. 3(E), an annular secondary light source 34B can be formed as shown in FIG. 3(F), quadrupolar light sources (not shown), and the like can be formed.

The spatial light modulator 25 for the object plane side (mask) of the projection optical system PL shown in FIG. 1 may have a structure that is similar to that of the spatial light modulator 13. However, each mirror element 5 in the spatial light modulator 25 is only required to be set at the first angle and the second angle as described above. Thus, the drive mechanism of the mirror element 5 may be simpler than the drive mechanism for the mirror elements 3 of the spatial light modulator 13.

Spatial light modulators that can be used as the spatial light modulators 13 and 25 are described in, for example, Japanese National Phase Laid-Open Patent Publication No. 10-503300 and its corresponding European Patent Publication No. 779530, Japanese Laid-Open Patent Publication No. 2004-78136 and its corresponding U.S. Pat. No. 6,900,915, Japanese National Phase Laid-Open Patent Publication No. 2006-524349 and its corresponding U.S. Pat. No. 7,095,546, and Japanese Laid-Open Patent Publication No. 2006-113437. When using these spatial light modulators in the illumination optical system ILS, the light traveling through each reflection surface of the spatial light modulator enters an intensity distribution formation system (the relay optical system 14) at a predetermined angle and forms a predetermined light intensity distribution on the illumination pupil plane in accordance with a control signal sent to the plurality of mirror elements (reflection elements).

Further, as the spatial light modulators 13 and 25, a spatial light modulator that is, for example, separately controllable of a plurality of two-dimensionally arranged mirror elements with respect to the reflection surface heights. Examples of such a spatial light modulator are described, for example, in Japanese Laid-Open Patent Publication No. 6-281869 and its corresponding U.S. Pat. No. 5,312,513, and in FIG. 1d of Japanese National Phase Laid-Open Patent Publication No. 2004-520618 and its corresponding U.S. Pat. No. 6,885,493. These spatial light modulators form a two-dimensional height distribution and thus affect incident light in the same manner as a phase-type diffraction grating.

The spatial light modulator having a plurality of two-dimensionally arranged reflection surfaces as described above may be modified in accordance with the disclosures of, for example, Japanese National Phase Laid-Open Patent Publication No. 2006-513442 and its corresponding U.S. Pat. No. 6,891,655 or Japanese National Phase Laid-Open Patent Publication No. 2005-524112 and its corresponding U.S. Patent Application Publication 2005/0095749.

Figure 5A:
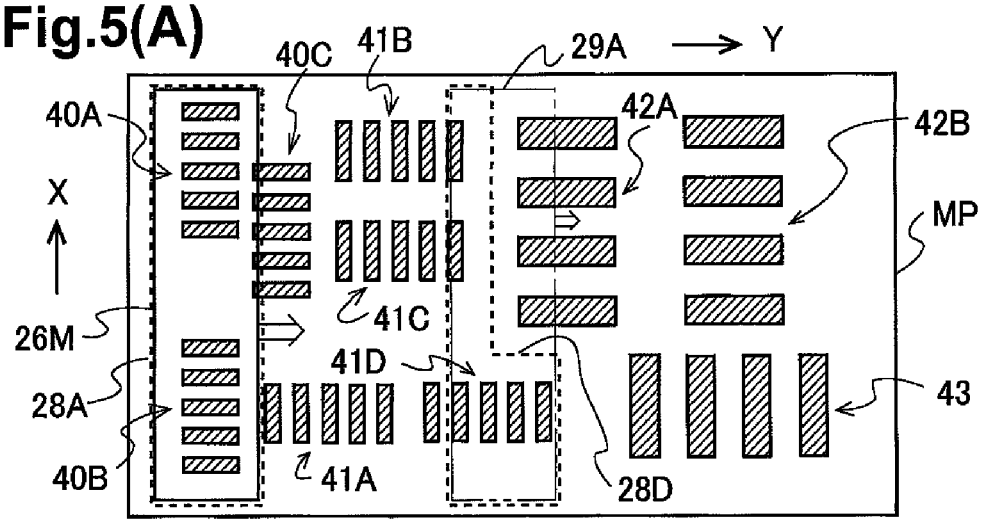
FIG. 5(A) is a diagram showing one example of a mask pattern MP.

One example of an exposure operation (controlled by the main control system) performed by the exposure apparatus 100 of this embodiment will now be discussed with reference to the flowchart of FIG. 7. In this case, for example, a reduced image of a mask pattern MP, which is shown in FIG. 5(A), is exposed onto the wafer W. Information on the mask pattern MP is stored in a storage of the main control system 30. The mask pattern MP includes line-and-space patterns (hereinafter referred to as the L&S patterns) 40A to 40C arranged at a pitch that is close to the resolution limit in the X direction, L&S patterns 41A to 41D arranged at a pitch that is close to the resolution limit in the Y direction, and L&S patterns 42A, 42B, and 43 arranged at a relatively rough pitch. The L&S patterns 40A to 40C etc. are shown in an enlarged manner. Further, the mask pattern MP may actually be shaped differently from the pattern projected onto the wafer W.

Figure 4C:
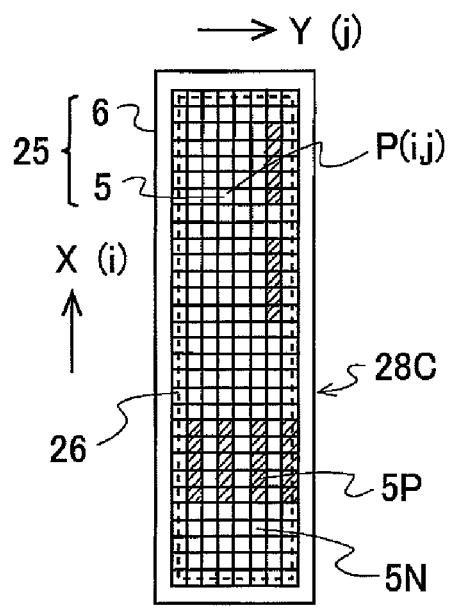
FIG. 4(C) is a diagram showing another example of a pattern on the reflection surface of the spatial light modulator 25.

The region on the mask pattern MP corresponding to the illumination region 26 on the spatial light modulator 25 of FIG. 4(A) defines a transferred region 26M. In this embodiment, the transferred region 26M is hypothetically moved on the mask pattern M at a constant velocity in the Y direction in an image memory of the main control system to form a light intensity distribution that corresponds to the pattern that varies in a timed manner in the transferred region 26M, and the wafer W of FIG. 1 is moved in synchronism with the movement of the transferred region in the Y direction, which is the corresponding scanning direction. Further, the hatched portions (L&S pattern 40 etc.) in the mask pattern MP of FIG. 5(A) are portions where the light intensity is strong. In a corresponding manner, for example, the mirror elements 5P, which are shown by hatched lines, in the spatial light modulator 25 of FIGS. 4(A) and 4(C) show portions where the light intensity is strong (portion at which the reflection light travels through the projection optical system PL).

For example, when exposing the L&S patterns 40A to 40C of FIG. 5(A), the X direction dipolar illumination that uses the secondary light sources 23C and 23D of FIG. 3(E) are desirable. When exposing the L&S patterns 41A to 41C, the Z direction (Y direction) dipolar illumination that uses the secondary light sources 23A and 23B of FIG. 3(B) are desirable. When exposing the L&S patterns 42A to 43, the normal illumination that uses the secondary light sources 24A is desirable.

Figure 6A:
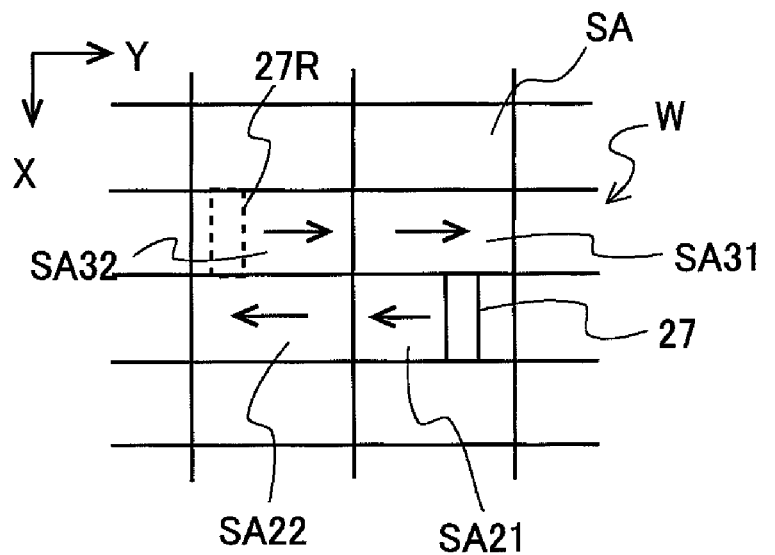
FIG. 6(A) is a diagram showing a shot region of a wafer during scanning exposure.
Figure 7:
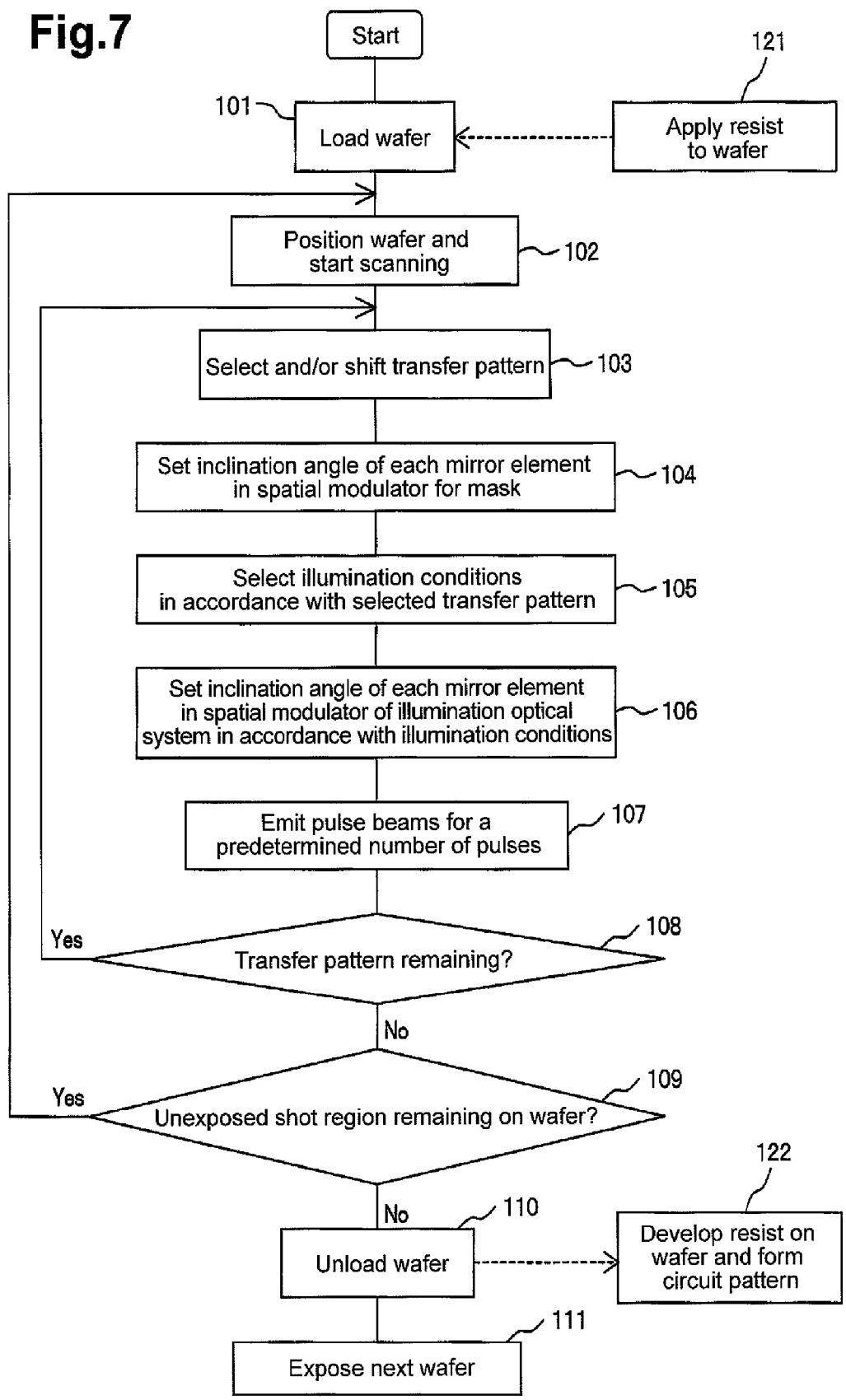
FIG. 7 is a flowchart showing one example of an exposure operation in the first embodiment.

First, in step 121 of FIG. 7, resist is applied to the wafer W. Then, in step 101, the wafer W is loaded onto the wafer stage WST of FIG. 1. As shown in FIG. 6(A), the surface of the wafer W is divided into shot regions SA onto which a reduced image (referred to as erected image to facilitate description) of the mask pattern MP of FIG. 5(A) is exposed and which are arranged at a predetermined pitch in the X direction and Y direction. Next, in step 102, after alignment of the wafer W, to expose shot regions SA21, SA22, . . . arranged in a single line in the Y direction on the wafer W of FIG. 6(A), the wafer is positioned at a scanning initiation position. Then, scanning of the transferred region 26M in the +Y direction is hypothetically initiated on the mask pattern MP of FIG. 5(A), and the scanning of the wafer W in the +Y direction at a constant velocity is synchronously initiated. The arrows in the shot regions SA21 of FIG. 5(A) show the movement direction of the exposure region 27 relative to the wafer W.

In step 103, the main control system 30 selects as a transfer pattern a pattern 28A, which is formed by the L&S patterns 40A to 40C, from the transferred region 56M of FIG. 5(A). Next, in step 104, the main control system 30 controls the inclination angle of the mirror elements 5 in the spatial light modulator 25 with the modulation control unit 45 and sets the distribution of the mirror elements 5P and 5N that correspond to the pattern 28A. Then, in step 105, the main control system 30 selects illumination conditions (here, dipolar illumination in the X direction) that are in accordance with the selected pattern 28A. In step 106, the main control system 30 sets the inclination direction and inclination angle of each mirror element 3 in the spatial light modulator 13 with the modulation control unit 31 of FIG. 1 and sets the dipolar secondary light source shown in FIG. 3(E).

In step 107, the main control system 30 provides the power supply control unit 9 of FIG. 1 with the light emission trigger pulses TP to emit the illumination light IL from the light source 10 for a predetermined number of pulse and exposes the pattern 28A of FIG. 4(A) onto the exposure region 27 of the wafer W. The predetermined number of pulses may be one or a plural number such as five or ten. Further, the predetermined number of pulses may be variable. The operations of steps 103 to 106 and step 108, which will be described below, are performed at high speeds, for example, during a single cycle of the pulse light emissions of the illumination light IL. Thus, the pulse lights of the illumination light IL are emitted in a substantially continuous manner when the wafer W is undergoing scanning exposure.

In step 108, when the mask pattern MP of FIG. 5(A) still includes a pattern that has not been transferred, the main control system 30 proceeds to step 103, selects a transfer pattern, and repeats the inclination angle setting for the mirror elements 5 in the spatial light modulator 25, the selection of the illumination conditions, the inclination direction and inclination angle setting for the mirror elements 3 in the spatial light modulator 13 in accordance with the selected illumination conditions, and the exposure for a predetermined number of pulses (steps 104 to 107). Steps 103 to 107 may be repeated a number of times on the same pattern (e.g., the L&S pattern 40a of FIG. 5(A)). During such processing, the wafer W undergoes scanning. The pattern generated by the spatial light modulator 25 of FIG. 1 is thus shifted in the Y direction. Ultimately, the predetermined number of pulses is adjusted so that the accumulated exposure amount on the wafer W for each pattern (e.g., the L&S pattern 40A) in the mask pattern MP of FIG. 5(A) becomes equal to a predetermined resist sensitivity. In this process, the energy of the pulse light varies between pulses. Therefore, to reduce exposure variations through an averaging effect, the number of accumulated pulses for obtaining the resist sensitivity may be greater than or equal to a predetermined value.

Figure 5B:
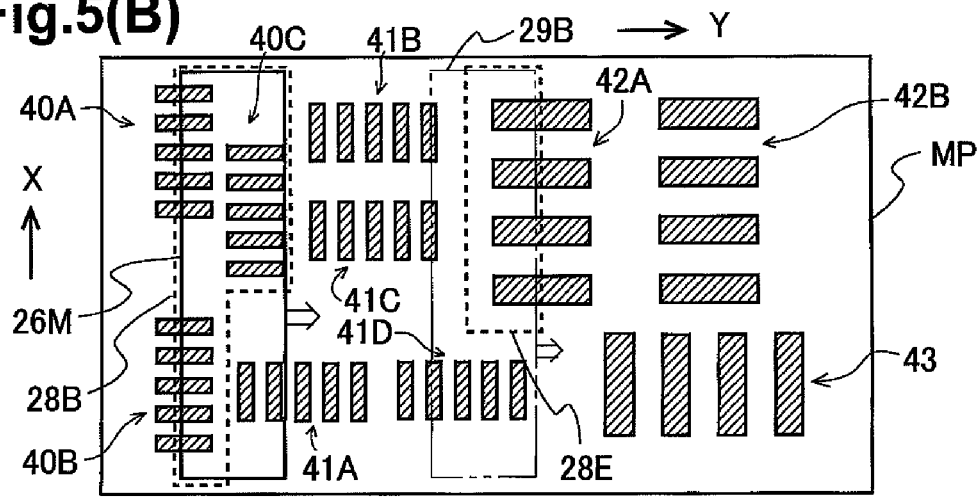
FIG. 5(B) is a diagram showing a state in which a transferred region 26M is moved from the state of FIG. 5(A)

Further, for example, as shown in FIG. 5(B), when the transferred region 26M moves, in addition to the L&S patterns 40A to 40C arranged in the X direction, the transferred region 26M also includes the L&S pattern 41A in the Y direction. In this case, for example, only the L&S patterns 40A to 40C are selected as a transfer pattern 283, and the illumination condition set accordingly by the spatial light modulator 13 is dipolar illumination in the X direction.

Figure 5C:
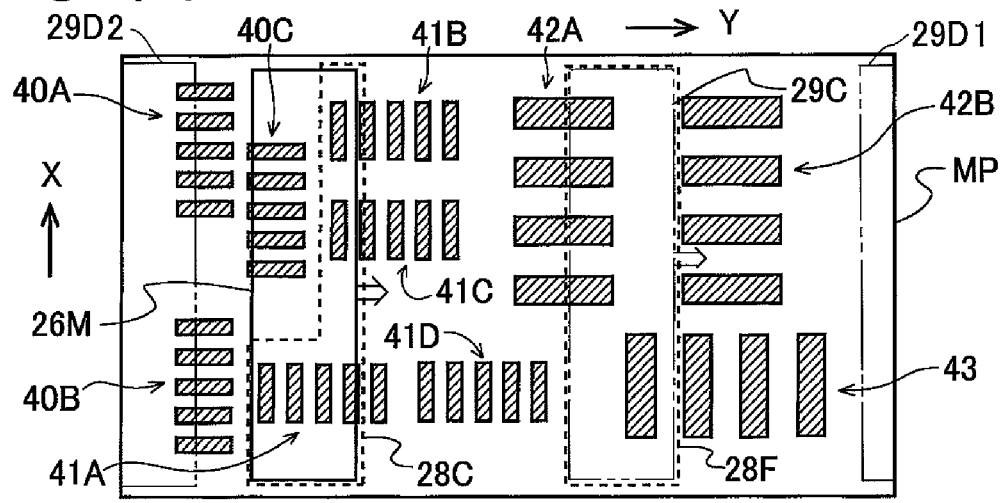
FIG. 5(C) is a diagram showing a state in which the transferred region 26M is moved from the state of FIG. 5(B)

Next, as shown in FIG. 5(C), when the transferred region 26M moves, for example, only the L&S patterns 41A to 41C arranged in the Y direction are selected as a transfer pattern 28C, and the spatial light modulator 25 accordingly sets the distribution of the mirror elements 5P and 5N that is in accordance with the pattern 28C as shown in FIG. 4(C). Further, to obtain the illumination condition of dipolar illumination in the Y direction, the spatial light modulator 13 sets the secondary light sources 23A and 23B shown in FIG. 3(B).

Subsequently, when the transferred region 26M moves to position 29A as shown by double-dashed line in FIG. 5(A), only the L&S patterns 41B to 41D arranged in the Y direction are selected as a transfer pattern 28D. Then, when the transferred region 26M moves to position 29B shown in FIG. 5(B), for example, only the L&S pattern 42A having a rough pitch is selected as a transfer pattern 28E. Further, for example, normal illumination is selected as the illumination condition, and the spatial light modulator 13 sets the round secondary light source 24A of FIG. 3(D). Afterwards, when the transferred region 26M moves by position 29C shown in FIG. 5(C), only the L&S patterns 42A to 43 having a rough pitch is the transfer pattern. Thus, the illumination condition may continue to be normal illumination.

In step 108, when there are no more non-transferred patterns in the mask pattern MP of FIG. 5(A), the scanning exposure of a single shot region SA21 is completed. Thus, the operation proceeds to step 109 in which it is determined whether there are still non-exposed regions left on the wafer W. At this point of time, as shown in FIG. 6(A), the shot region SA22 adjacent to the shot region SA21 on the wafer W has not been exposed. Thus, the operation returns to step 102. In this case, while scanning the wafer W in the same direction, as shown in FIG. 5(A), the transferred region 26M is hypothetically moved to the −Y direction end of the mask pattern MP, and the operation of steps 103 to 108 are repeated. At the boundary of the shot regions SA21 and SA22 that are adjacent to each other in the scanning direction on the wafer W, the transferred region 26M is set to the two ends of the mask pattern MP, and the spatial light modulator 25 of FIG. 4(A) forms a pattern by synthesizing the patterns at positions 29D1 and 29D2 to continuously expose shot regions SA21 to SA22.

In step 109, to further expose a line including shot regions SA31 and SA32 that are adjacent to each other in the X direction on the wafer W as shown in FIG. 6(A), the operation proceeds to step 102 in which the wafer state WST is driven to step-move the wafer W in the X direction. Then, the scanning direction of the wafer for the exposure region at position 27R is reversed to the −Y direction, the hypothetic moving direction of the transferred region 26M is set to the −Y direction as viewed in FIG. 5(A), and steps 103 to 108 are repeated.

In step 109, when there are no more unexposed shot regions on the wafer W, in step 110, the wafer W undergoes unloading, and exposure is performed on the next wafer (step 111). Further, in step 122, the exposed wafer undergoes resist development, heating (curing), and a circuit formation process such as etching. The wafer repetitively undergoes such exposure and development (lithography) and such processes and then undergoes a device assembly process (processing such as dicing, bonding, and packaging) to manufacture a semiconductor device or the like.

In this manner, in the exposure apparatus 100 of this embodiment, by using the spatial light modulator 25, even when there are patterns in the same transferred region 26M, the patterns actually transferred onto the wafer W may be grouped and selected in according with the cyclic direction and miniaturization level, and the illumination conditions may be optimized by the spatial light modulator 13 in accordance with the selected pattern. Accordingly, the mask pattern MP of FIG. 5(A) including various types of patterns can be exposed with an illumination condition that is optimal for each type of pattern. Therefore, the plurality of mirror elements 5 in the spatial light modulator 25 are separately controlled so that the inclination angle and inclination direction are in accordance with the pattern that is to be transferred (or formed) onto the wafer W or pitch and direction of such a pattern. Further, the plurality of mirror elements 3 in the spatial light modulator 13 are separately controlled so that the inclination angle and inclination direction are in accordance with the pattern that is to be transferred (or formed) onto the wafer W or pitch and direction of such pattern or in accordance with the conversion state of the spatial light modulator 25. During such control, in this embodiment, the pattern that is to be transferred is selected in a timed manner. Thus, the transfer pattern does not have to be selected, for example, in accordance with the polarization state of the illumination light, and various types of patterns may be included in the mask pattern MP.

This embodiment has the advantages described below.

(1) An exposure method performed by the exposure apparatus 100 of FIG. 1 in this embodiment exposes a wafer W (object) with illumination light IL emitted in a plurality of pulse lights. The exposure method includes step 104 for separately controlling the plurality of mirror elements 5 (reflection elements serving as second optical elements) of the spatial light modulator 25 with respect to the state of the reflection surfaces (and ultimately the conversion state of the spatial light modulator 25), step 106 for controlling the plurality of mirror elements 3 (reflection elements serving as first optical elements) of the spatial light modulator 13 with respect to the state of the reflection state (and ultimately the conversion state of the spatial light modulator 13) to control the intensity distribution of the illumination light IL on a predetermined plane, and step 107 for guiding light from the plurality of mirror elements 3 illuminated by the illumination light IL to the plurality of mirror elements 5 and exposing the wafer W with the light from the plurality of mirror elements 5.

Further, the exposure apparatus 100 of FIG. 1 illuminates an irradiated plane with illumination light IL emitted in a plurality of pulse lights and exposes a wafer W with the illumination light IL that travels through the irradiated plane or a plane near the irradiated plane. The exposure apparatus 100 includes the illumination optical system ILS including the spatial light modulator 13 (first optical device), which includes the plurality of mirror elements 3 arranged upstream (entering direction of the illumination light IL) of the irradiated plane, the spatial light modulator 25 (second optical device) including the plurality of mirror elements 5, and the main control system 30 and the modulation control units 31 and 45 (illumination controller) for controlling the conversion state of the spatial light modulator 25 or the conversion state of the spatial light modulator 13. In this embodiment, the illumination controller is a device including the main control system 30 and the modulation control units 31 and 45. However, for example, if the modulation control units 31 and 45 share the functions of the main control system 30, the illumination controller may be a device formed by the modulation control units 31 and 45.

The light that enters a wafer W is light contributing to imaging on the wafer W (exposure light), that is, light substantially corresponding to a transfer pattern. Further, light that does not enter the wafer W is light that does not contribute to imaging on the wafer (non-exposure light). For example, such light may be prevented from entering the projection optical system PL. Alternatively, such light may be shielded by an aperture stop (not shown) in the projection optical system PL.

In this embodiment, the plurality of mirror elements 5 are separately controlled with respect to the state of the reflection surfaces. This forms a light intensity distribution that is in accordance with plural types of patterns in a timed manner. Further, the plurality of mirror elements 3 are separately controlled in a timed manner. This optimizes the distribution of the irradiation angle of the illumination optical system ILS with respect to the mirror elements 5 (illumination conditions). Accordingly, a mask pattern including plural types of pattern may be exposed with a high throughput, while optimizing the illumination conditions for each pattern.

(2) In step 104, the main control system 30 and the modulation control unit 45 control the plurality of mirror elements 5 separately so that the state (inclination angle) of the reflection surfaces is in accordance with the pattern that is to be formed on the wafer W. Further, in step 104, the main control system 30 and the modulation control unit 45 control the plurality of mirror elements 5 separately so that the state (e.g., inclination angle) is in accordance with the pitch and direction of the patterns that are to be formed on the wafer W. Further, in step 106, the main control system 30 and the modulation control unit 31 control the plurality of mirror elements 3 separately so that the state (inclination direction and inclination angle) of the reflection surfaces is in accordance with the conversion state of the spatial light modulator 25 or the pattern that is to be formed on the wafer W. Further, in step 106, the main control system 30 and the modulation control unit 31 control the plurality of mirror elements 3 separately so that the state (e.g., inclination direction and inclination angle) of the reflection surfaces is in accordance with the pitch and direction of the patterns that are to be formed on the wafer W.

In this manner, the illumination conditions are easily optimized in accordance with the mask pattern (or conversion state of spatial light modulator 25) or pattern that is to be formed (exposed) on the wafer W.

Further, exposure may be performed with illumination conditions that are optimized in accordance with the mask pattern (or conversion state of the spatial light modulator 25) or pattern that is to be formed on the mask W. This reduces the amount of lost light and enables exposure of a satisfactory pattern.

(3) The predetermined plane is a pupil surface of the illumination optical system ILS (illumination pupil plane 22) but may be a plane near the pupil plane. Further, the predetermined plane may be a plane conjugated with the illumination pupil plane 22 or a plane near such conjugated plane.

(4) Further, in the above-described embodiment, whenever the illumination light IL is emitted for a predetermined number of pulses, in steps 104 and 106, the setting of the state of the reflection surfaces of the plurality of mirror elements 5 and the setting of the state of the reflection surfaces of the plurality of mirror elements 3 are switched. Accordingly, the switching of patterns that are to be exposed onto the wafer W and the optimization of the illumination conditions may be performed at high speeds.

Especially, when the predetermined number of pulses is one, the switching of patterns is performed at the highest speed. As a result, even if the mask pattern MP includes an extremely wide variety of patterns, the mask pattern MP can be exposed with a single scanning exposure by optimizing the illumination condition of each pattern.

(5) In other words, in step 104, whenever the illumination light IL is emitted for a predetermined number of pulses, the state of each light beam from the plurality of mirror elements 5 in the spatial light modulator 25 of FIG. 1 is switched to a first state (e.g., the state of the light intensity distribution of the L&S patterns in the X direction of FIG. 4(A)) or a second state (e.g., the state of the light intensity distribution of the L&S patterns in the Y direction of FIG. 4(C)).

In correspondence, in step 106, whenever the illumination light IL is emitted for a predetermined number of pulses, the state of each light beam from the plurality of mirror elements 3 in the spatial light modulator 13 is switched to a third state (e.g., the state of dipolar illumination in the X direction of FIG. 3(E)) in correspondence with the first state or the state of each light beam from the plurality of mirror elements 3 in the spatial light modulator 13 is switched to a fourth state (e.g., the state of dipolar illumination in the Y direction of FIG. 3(B)) in correspondence with the second state. This optimizes the illumination condition for each pattern.

(6) In step 107, with respect to the plurality of mirror elements 5 in the spatial light modulator 25, the wafer W is exposed while scanning the wafer W in a predetermined direction (Y direction, which is the scanning direction) with the wafer stage WST. In step 104, in accordance with the scanning of the wafer W in the Y direction, the plurality of mirror elements 5 are separately controlled so that the states of the light beams are in correspondence with the patterns of the transfer subject that are varied. Thus, even if the mask pattern MP is elongated in a predetermined manner, the mask pattern MP can be exposed onto the wafer W through a single scanning exposure.

Figure 6B:
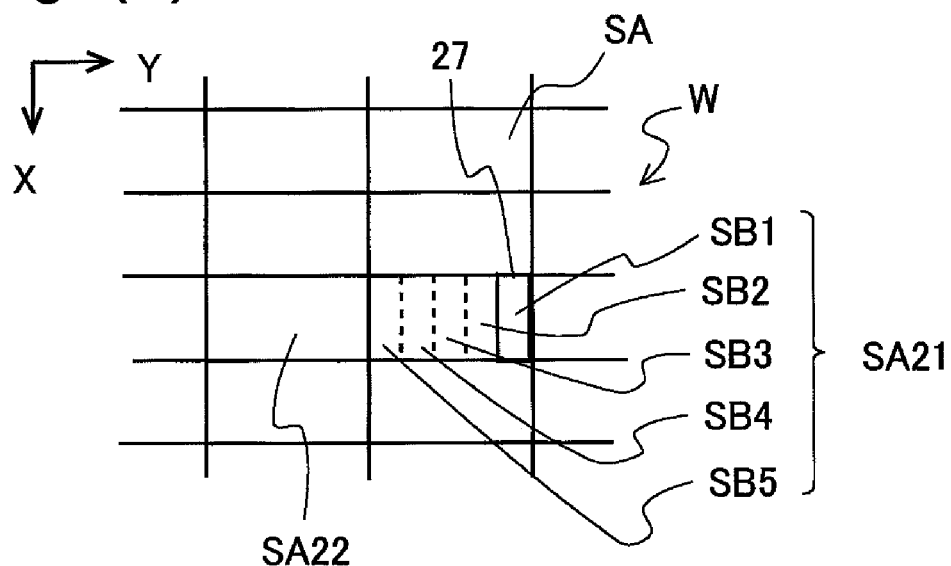
FIG. 6(B) is a diagram shot region of a wafer during step and repeat exposure.

(7) In the exposure apparatus 100 of FIG. 1, the variable pattern (light intensity distribution) set by the spatial light modulator 25 may be exposed onto the wafer W in accordance with the step and repeat technique through the projection optical system PL. In this case, the wafer state WST only needs to function to step-move in the X direction and Y direction. Further, as shown in FIG. 6(B), like the shot region SA21, each shot region SA in the wafer W is divided into a plurality of shot region portions SB1 to SB5 in correspondence with the size of the exposure region 27 of FIG. 1.

In the exposure region 27, after exposing the shot region SB1 portion in the shot region SA12, the operation for step-moving the wafer W in the Y direction with the wafer stage WST and the operation of steps 103 to 107 in FIG. 7 are repeated to perform exposure on the other shot region portions SB2 to SB5. Furthermore, when one of the shot region portions SB1 to SB5 undergoes exposure, the illumination condition can be optimized and exposure can be performed for a predetermined number of pulses so that the accumulated exposure amount reaches the resist sensitivity for each of different types of patterns like the L&S pattern 40C arranged in the X direction and the L&S patterns 41A to 41C arranged in the Y direction in the mask pattern MP of FIG. 5(A).

(8) In the first embodiment, step 104 of FIG. 7 includes, for example, setting the state of the reflection surface of each of the plurality of mirror elements 5 in the spatial light modulator 25 to either one of a state (first angle) in which the reflection light from the reflection surface enters the wafer W and a state (second angle) in which the reflection light does not enter the wafer W. Step 106 includes setting the state of the reflection surface of each of the plurality of mirror elements 3 in the spatial light modulator 13 so that the inclination angle about two axes is within a variable range.

Accordingly, the drive mechanism for the plurality of mirror elements 5 can be simplified. Further, the plurality of mirror elements 3 maintain the usage efficiency of the illumination light IL at a high level and facilitates the formation of secondary light sources having various shapes.

The mirror element 3 of the spatial light modulator 13 may be set so that the reflection surface inclination angle about one surface is within a variable range. In such a case, the usage efficiency of the illumination light IL would decrease. However, the light from the mirror elements 3 used to form a secondary light source may be set so as not to enter the fly's eye lens 15.

(9) Further, in FIG. 1, the plane on which the spatial light modulator 25 is arranged (or the plane on which the mirror elements 5 are arranged) is generally parallel to the exposure surface of the wafer W (upper surface of resist). This facilitates the designing and manufacturing of the exposure apparatus.

(10) In the above-described embodiment, the illumination light IL is pulse lights emitted from an excimer light source but may instead be pulse lights emitted from a solid laser light source. The solid laser light source increases the pulse frequency to 1 to 2 MHz. Thus, by switching the state of the reflection surfaces of the mirror elements 5 and the mirror elements 3 at high speeds in synchronism with the pulse frequency, a mask pattern including more types of patterns may be exposed onto a wafer within a short period of time during a single exposure.

(11) The exposure apparatus 100 includes the light source 10 (light source unit), which generates a plurality of pulse lights (illumination light). Thus, the emission timing and the like of the pulse lights can be controlled with high accuracy.

(12) The method for manufacturing a device in the above-described embodiment includes exposing a wafer W using the exposure method of the above-described embodiment and processing the exposed wafer W (step 122).

The device manufacturing method includes performing lithography with the exposure apparatus 100 of the above-described embodiment. The device manufacturing method manufactures a device that includes many types of circuit patterns with a high throughput and high accuracy.

The first embodiment may be modified as described below.

(13) In the embodiment of FIG. 1, as the first and second optical devices that includes the plurality of first and second optical elements, the spatial light modulator 25, which includes the plurality of mirror elements 5 (reflection elements), and the spatial light modulator 13, which includes the plurality of mirror elements 3 (reflection elements), may be used. However, in lieu of a modulator for at least either one of the spatial light modulator 25 and the spatial light modulator 13, a liquid crystal cell including a plurality of pixels (transmissive elements) that control the amount of transmitted light or a phase device including a plurality of phase elements (variable step elements or the like) that control the phase of the transmitted light may be used.

(14) Instead of the fly's eye lens 15 of FIG. 1 which is a wavefront division type integrator, a rod type integrator may be used as an inner surface reflective type optical integrator. In this case, as shown in FIG. 1, a converging optical system is additionally arranged toward the spatial light modulator 25 from the relay optical system 14 to form a plane conjugated with the reflection surfaces of the spatial light modulator 13, and the rod type integrator is positioned so that its incident end is located near the conjugated plane.

Further, a relay optical system is used to form on the reflection surface of the spatial light modulator an image of an illumination field stop, which is arranged on an emission end surface of the rod type integrator or near the emission end surface. In this structure, the secondary light source is formed on a pupil plane of the relay optical system 14 and the converging optical system (a virtual image of a secondary light source is formed near the incident end of the rod type integrator). Further, a relay optical system for guiding light from the rod type integrator to the spatial light modulator 25 serves as a light guide optical system.

[Second Embodiment]

A second embodiment of the present invention will now be discussed with reference to FIG. 8.

Figure 8:
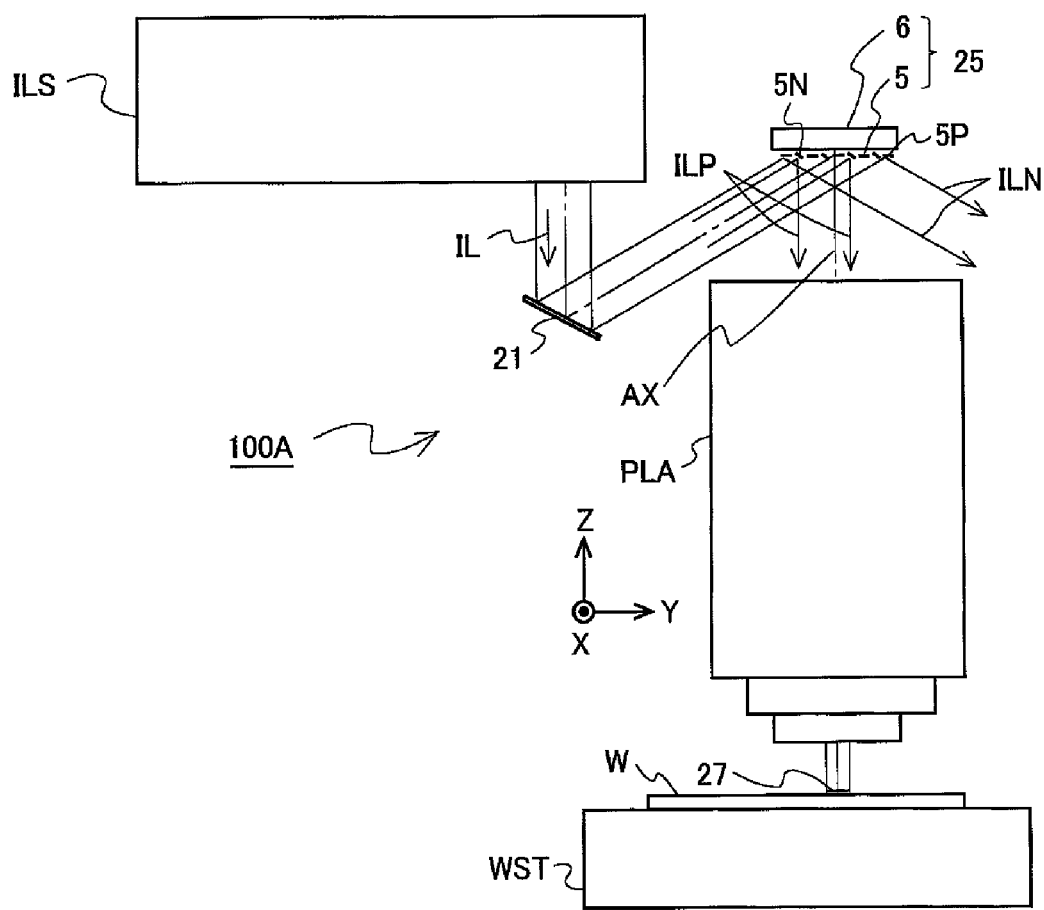
FIG. 8 is a schematic diagram showing an exposure apparatus according to a second embodiment of the present invention.

FIG. 8 is a schematic diagram showing an exposure apparatus 100A of this embodiment. In FIG. 8, in which same reference numerals are given to those components that are the same as the corresponding components of FIG. 1, a projection optical system PLA, which projects a reduced image of a variable pattern (light intensity distribution) formed by the plurality of mirror elements 5 in the spatial light modulator 25 onto the wafer W, is telecentric toward both of the spatial light modulator 25 (object plane) and the wafer W (image plane). Thus, the spatial light modulator 25 is arranged above the projection optical system PLA so that its center is substantially aligned with the optical axis of the projection optical system PLA. Further, the plane on which the mirror elements 5 in the spatial light modulator 25 are arranged is substantially parallel to the exposure surface of the wafer W.

In this embodiment, the illumination light IL, which are pulse lights from the illumination optical system ILS, travels via the mirror 21 and then diagonally upward to enter the plurality of mirror elements 5 in the spatial light modulator 25. The reflection beam ILN from each mirror element 5P, the reflection surface of which is set at a first angle parallel to the XY plane (state in which the drive power is cut off), does not contribute to imaging on the wafer (e.g., does not enter the projection optical system PLA). The reflection beam ILN from each mirror element 5P, the reflection surface of which is set at a first angle parallel to the XY plane (state in which the drive power is cut off), does not contribute to imaging on the wafer (e.g., does not enter the projection optical system PLA). The reflection light from each mirror element 5N, the reflection surface of which is set at a second angle (state in which the drive power is supplied), enters the projection optical system PLA and becomes an effective imaging light beam ILP to expose the wafer W. The remaining structure is the same as the first embodiment.

In the exposure apparatus 100A of this embodiment, the projection optical system, which is telecentric to two sides, may be used. Further, the plane on which the spatial light modulator 25 is arranged (or the surface on which the mirror elements 5 are arranged) may be substantially parallel to the exposure surface of the wafer W. Thus, the designing and manufacturing of the exposure apparatus is facilitated.

[Third Embodiment]

A third embodiment of the present invention will now be discussed with reference to FIG. 9.

Figure 9:
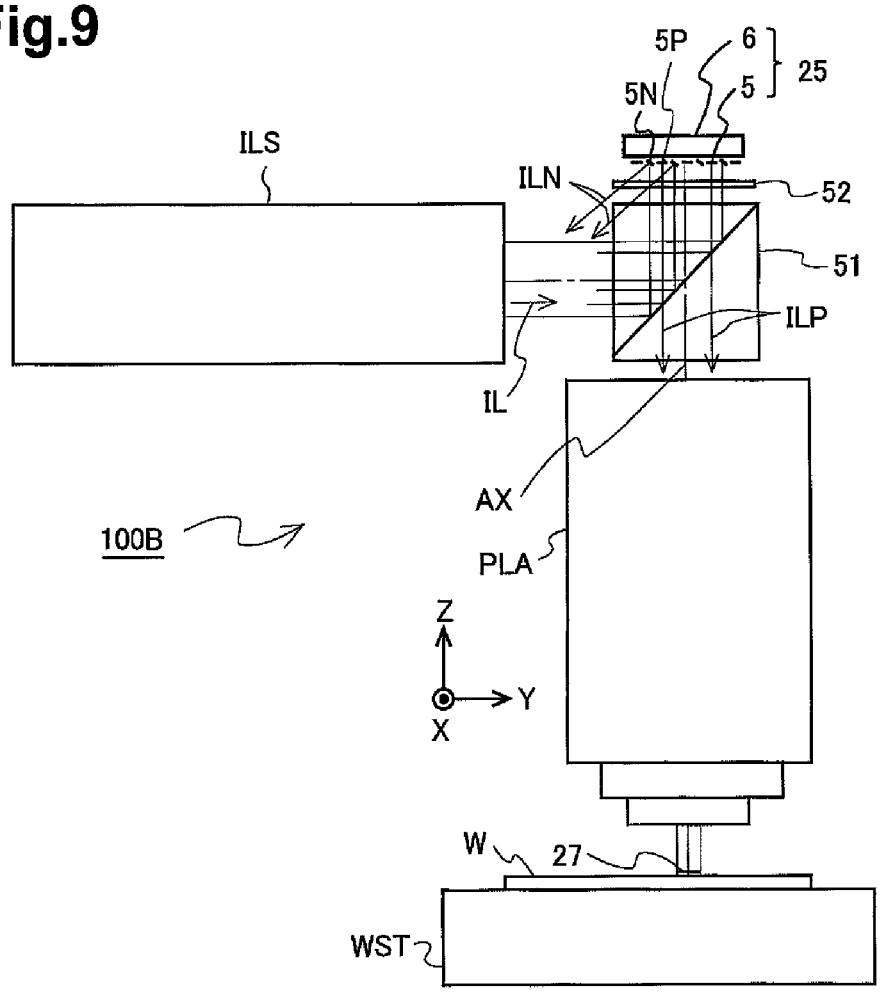
FIG. 9 is a schematic diagram showing an exposure apparatus according to a third embodiment of the present invention.

FIG. 9 schematically shows the structure of an exposure apparatus 100B in this embodiment. In FIG. 9, in which same reference numerals are given to those components that are the same as the corresponding components of FIG. 1, the spatial light modulator 25 is arranged along the optical axis AX above a projection optical system PLA, which is telecentric to two sides. The spatial light modulator 25 includes a polarization beam splitter (hereafter, referred to as PBS) 51, a quarter wavelength plate 52, and a plurality of mirror elements 5. The illumination optical system ILS of this embodiment differs from the first embodiment in that the mirror 18 is eliminated from the illumination system ILS and in that the illumination light IL is directly emitted in the +Y direction toward the PBS 51. Further, the illumination light IL is linear polarized light of S-polarization (polarization direction is orthogonal to an incident surface on a beam splitter surface) with respect to the PBS 51.

In this case, the illumination light IL entering the PBS 51 is reflected upward and converted to circular polarized light by the quarter wavelength plate 52 and then enters the plurality of mirror elements 5 in the spatial light modulator 25 substantially orthogonal to the reflection surfaces in a state in which the drive power is cut off. The reflection beams from the mirror elements 5P, the reflection surfaces of which are set at the first angle (state in which the drive power is cut off) become effective imaging light beams ILP and enter the quarter wavelength plate 52 along the optical axis AX thereby become P-polarized light, which is transmitted through the PBS 51 to enter the projection optical system PLA and expose the wafer W. The reflection beams ILN from the mirror elements 5N, the reflection surfaces of which are set at the second angle (state in which the drive power is cut off), do not contribute to imaging on the wafer W (for example, does not enter the projection optical system PL). The remaining structure is the same as the first embodiment.

In addition to the advantages of the first embodiment, this embodiment has the advantages described below.

(1) The exposure apparatus 100B of FIG. 9 uses the projection optical system PLA, which is telecentric to two sides. Further, the plane on which the spatial light modulator 25 is arranged (or the plane on which the mirror elements are arranged) is substantially parallel to the exposure surface of the wafer W. Thus, the designing and manufacturing of the exposure apparatus is facilitated.

(2) Further, in a process corresponding to step 107 of FIG. 7 (process for irradiating the wafer W with the illumination light IL), the illumination light IL (pulse lights) from the plurality of mirror elements 3 (refer to FIG. 1) in the spatial light modulator 13 of the illumination optical system ILS of FIG. 9 orthogonally (generally orthogonal to the reflection surfaces in a state in which the drive power is cut off) enters the plurality of mirror elements 5 in the spatial light modulator 25. Accordingly, adjustments of the optical systems are facilitated.

(3) The PBS 51 (first optical member), which is used so that the illumination light IL orthogonally enters the spatial light modulator 25, is arranged between the spatial light modulator 13 in the illumination optical system LS and the spatial light modulator 25. Accordingly, the illumination light IL orthogonally enters the spatial light modulator 25 with a simple structure. Thus, adjustments of the optical systems are facilitated, and a projection optical system that is telecentric in two sides may be used. Further, due to the use of the quarter wavelength plate 52 in addition to the PBS 51, there is no lost light at the PBS 51, and the usage efficiency of the illumination light IL is high.

The quarter wavelength plate 52 may be eliminated and a normal beam splitter may be used in lieu of the PBS 51 although this would decrease the usage efficiency of the illumination light IL.

The present invention may also be applied to an immersion type exposure apparatus described in, for example, PCT Publication No. 99/49504 or a proximity type exposure apparatus that does not include a projection optical system.

Further, the present invention is not limited to applications for manufacturing processes of semiconductor devices but may also be widely applied to, for example, manufacturing processes for liquid crystal devices, plasma displays, and the like, and manufacturing processes for various types of devices (electronic devices) such as imaging devices (CMOS, CCD, etc.), micro-machines, microelectromechanical systems (MEMS), thin film magnetic heads, and DNA chips. The present invention may be embodied in many other specific forms without departing from the spirit or scope of the invention.

What is claimed is:

1. An exposure apparatus for illuminating an irradiated plane with a plurality of pulse lights and exposing an object arranged on an object plane with the plurality of pulse lights from the irradiated plane, the exposure apparatus comprising:
    an illumination optical system including:
        a first optical device including a plurality of first optical elements arranged on a first plane upstream of the irradiated plane in an optical path of the pulse lights;
        a first plurality of optical components disposed to distribute on a pupil plane the pulse lights travelling via the first optical device; and
        a second plurality of optical components disposed to illuminate the irradiated plane with the pulse lights from the pupil plane;
        a second optical device including a plurality of second optical elements that are arranged on the irradiated plane or a plane near the irradiated plane;
    a projection optical system that is arranged between the irradiated plane and the object plane and guides the pulse lights travelling via the second optical device to the object; and
    an illumination controller which controls a conversion state of the first optical device whenever a predetermined number of pulse lights are emitted.

2. The exposure apparatus according to claim 1, wherein the illumination controller controls the conversion state of the first optical device in accordance with a pattern that is to be formed on the object.

3. The exposure apparatus according to claim 1, wherein the illumination controller controls the conversion state of the first optical device to control intensity distribution of the pulse lights on a predetermined plane between the first optical device and the second optical device.

4. The exposure apparatus according to claim 3, wherein the predetermined plane is an illumination pupil plane of the illumination optical system or a plane conjugated with the illumination pupil plane.

5. The exposure apparatus according to claim 3, wherein the illumination controller varies the intensity distribution of the pulse lights on the predetermined plane with the first optical device to control an incident angle and incident direction of the pulse lights entering the second optical device.

6. The exposure apparatus according to claim 1, wherein the illumination controller controls a conversion state of the second optical device and controls the conversion state of the first optical device in accordance with the conversion state of the second optical device.

7. The exposure apparatus according to claim 1, wherein the illumination controller controls the conversion state of the second optical device in accordance with a pattern that is to be formed on the object.

8. The exposure apparatus according to claim 1, wherein the illumination controller controls a conversion state of the second optical device and switches the conversion state of the second optical device whenever a second predetermined number of the pulse lights is emitted.

9. The exposure apparatus according to claim 1, further comprising:
    a stage which scans the object in a predetermined direction relative to the second optical device,
    wherein the illumination controller controls a conversion state of the second optical device in accordance with the scanning of the object in the predetermined direction performed by the stage.

10. The exposure apparatus according to claim 1, further comprising:
    a stage which step-moves the object in two intersecting directions relative to the second optical device,
    wherein the illumination controller controls a conversion state of the second optical device and exposes the object with light from the second optical device directed toward the object whenever the object is step-moved by the stage.

11. The exposure apparatus according to claim 1, wherein the illumination controller controls the conversion state of the first optical device in accordance with the pitch and direction of a pattern that is to be formed on the object.

12. The exposure apparatus according to claim 11, wherein the illumination controller controls the conversion state of the second optical device in accordance with the pitch and direction of a pattern that is to be formed on the object.

13. The exposure apparatus according to claim 1, wherein the illumination controller controls an incident angle and incident direction of the pulse lights entering the second optical device in accordance with the pitch and direction of a pattern that is to be formed on the object.

14. The exposure apparatus according to claim 1, wherein the first optical elements and/or the second optical elements are reflective elements.

15. The exposure apparatus according to claim 14, wherein the illumination controller controls a conversion state of the second optical device and wherein the second optical device sets a reflection surface of each of the second optical elements in either one of a state in which reflection light from the reflection surface enters the object and a state in which the reflection light does not enter the object.

16. The exposure apparatus according to claim 14, wherein the first optical device adjusts an inclination angle of a reflection surface of each of the second optical elements to a set angle about at least one axis within a variable range.

17. The exposure apparatus according to claim 1, wherein the first optical elements and/or the second optical elements are transmissive elements.

18. The exposure apparatus according to claim 1, wherein the first optical elements and/or the second optical elements are phase elements.

19. The exposure apparatus according to claim 1, wherein the plane on which the second optical elements of the second optical device are arranged is generally parallel to the object plane.

20. The exposure apparatus according to claim 1, further comprising:
    a first optical member which is arranged between the second optical device and the first optical device and which has the pulse lights orthogonally enter the second optical elements of the second optical device.

21. The exposure apparatus according to claim 20, wherein the first optical member includes a polarization beam splitter.

22. The exposure apparatus according to claim 1, wherein the first plurality of optical components includes:
    an optical integrator which uniformly illuminates the second optical device with light from the first optical device illuminated by the pulse lights.

23. The exposure apparatus according to claim 1, further comprising a light source which emits the pulse lights.

24. The exposure apparatus according to claim 1, further comprising a solid laser light source which emits the pulse lights.

25. The exposure apparatus according to claim 1, wherein the projection optical system includes an aperture stop, and the pupil plane is a location optically conjugated with the aperture stop.

26. The exposure apparatus according to claim 1, wherein the illumination controller varies a conversion state of the first optical device to change intensity distribution of the pulse lights on the pupil plane.

27. The exposure apparatus according to claim 1, wherein the illumination controller varies states of the plurality of first optical elements of the first optical device independently from one another.

28. The exposure apparatus according to claim 1, wherein the first optical device divides the pulse lights entering the first optical device by the plurality of the first optical elements.

29. The exposure apparatus according to claim 28, wherein the divided pulse lights from the plurality of the first optical elements of the first optical device are deflected in predetermined directions and predetermined angles.

30. The exposure apparatus according to claim 29, wherein the first plurality of optical components guides the lights deflected in the predetermined directions and the predetermined angles to locations that are in accordance with the predetermined directions and the predetermined angles.

31. The exposure apparatus according to claim 1, wherein the first optical device provides an angular distribution to light entering the first optical device.

32. The exposure apparatus according to claim 31, wherein the first plurality of optical components guides the light having the angular distribution to the pupil plane in accordance with the angular distribution.

33. The exposure apparatus according to claim 1, wherein the illumination controller controls the conversion state of the first optical device based on illumination information received by the illumination controller.

34. The exposure apparatus according to claim 1, wherein the second optical elements are smaller than the first optical elements.

* * * * *